United States Patent
Peckham et al.

(10) Patent No.: US 6,626,106 B2
(45) Date of Patent: Sep. 30, 2003

(54) CLEANING APPARATUS IN A STENCIL PRINTER

(75) Inventors: Randy Leon Peckham, Glocester, RI (US); Joseph A. Perault, Framingham, MA (US)

(73) Assignee: Speedline Technologies, Inc., Franklin, MA (US)

(*) Notice: Subject to any disclaimer, the term of this patent is extended or adjusted under 35 U.S.C. 154(b) by 0 days.

(21) Appl. No.: 09/836,899

(22) Filed: Apr. 17, 2001

(65) Prior Publication Data

US 2002/0148374 A1 Oct. 17, 2002

(51) Int. Cl.[7] .............................................. B41F 35/00
(52) U.S. Cl. ....................................... 101/424; 101/483
(58) Field of Search ................................ 101/424, 425, 101/483, 129; 15/256.51, 256.52

(56) References Cited

U.S. PATENT DOCUMENTS

| | | | | |
|---|---|---|---|---|
| 3,592,136 A | * | 7/1971 | Selman ........................ 101/423 |
| 4,887,623 A | * | 12/1989 | Sugiyama et al. ......... 134/64 R |
| 4,911,074 A | * | 3/1990 | Simila ......................... 101/425 |
| 4,924,304 A | | 5/1990 | Freeman ...................... 358/101 |
| 5,060,024 A | | 10/1991 | Kohmura et al. ........... 355/283 |
| 5,080,015 A | | 1/1992 | Hansson et al. ............ 101/483 |
| 5,947,022 A | | 9/1999 | Freeman et al. ............ 101/123 |
| 5,976,269 A | * | 11/1999 | Hamasaki et al. .......... 101/425 |
| 6,036,787 A | * | 3/2000 | Bennett et al. ............. 101/425 |
| 6,237,484 B1 | * | 5/2001 | Homma et al. ............. 101/425 |
| 6,263,795 B1 | * | 7/2001 | Gasparrini et al. ......... 101/424 |

* cited by examiner

*Primary Examiner*—Andrew H. Hirshfeld
*Assistant Examiner*—Anthony H. Nguyen
(74) *Attorney, Agent, or Firm*—Mintz, Levin, Cohn, Ferris, Glovsky and Popeo, P.C.

(57) ABSTRACT

An apparatus and method for cleaning excess solder paste that is deposited on a stencil in a stencil printer. The apparatus includes a solvent bath containing a pool of solvent in which a bar is disposed in the solvent bath. The bar rotates in the solvent bath and surface tension between the bar and the solvent causes the solvent to uniformly adhere to the bar. The bar is used to apply solvent to a cleaning material that is used to wipe excess solder paste from the stencil.

15 Claims, 4 Drawing Sheets

CLEANING APPARATUS IN A STENCIL PRINTER

BACKGROUND OF THE INVENTION

1. Field of the Invention

The present invention relates to an apparatus and method for cleaning a device and in particular to an apparatus and method for cleaning a screen or stencil in a screen or stencil printer.

2. Background of the Invention

In typical surface-mount circuit board manufacturing operations, a stencil printer is used to print solder paste onto a circuit board. Typically, a circuit board having a pattern of pads or some other, usually conductive, surface onto which solder paste will be deposited is automatically fed into the stencil printer and one or more small holes or marks on the circuit board, called fiducials, is used to properly align the circuit board with the stencil or screen of the stencil printer prior to the printing of solder paste onto the circuit board. Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain desired viscosity to facilitate filling of the apertures in the screen or stencil. The solder paste is typically dispensed onto the stencil from a standard cartridge such as that manufactured by SEMCO Corporation.

In some prior art stencil printers, any excess solder paste remaining under the squeegee after it has fully traversed the stencil, remains on the stencil when the squeegee is returned to its initial position for printing on a second circuit board. In some prior art screen printers, a second squeegee is used that moves across the stencil in the direction opposite to that of the first squeegee. The first squeegee and the second squeegee are used on alternating boards to continually pass the roll of solder paste over the apertures of a stencil to print each successive circuit board. Usually, as the squeegees pass the solder paste over the apertures minute amounts of solder paste seep through the apertures to accumulate at the bottom side of the stencil. This presents various problems such as the solder paste being inadvertently disposed on unintended areas of the circuit board. Also, as the solder paste hardens, it complicates the alignment procedure of a circuit board with the stencil. Therefore it is desirable to remove the excess solder paste at the bottom of the stencil.

According to one prior art stencil printer, after several prints, a stencil wiper apparatus in the stencil printer that is situated near the vicinity of the stencil moves beneath the stencil from one end to the other end. As the stencil wiper apparatus moves beneath the stencil, it wipes off excess solder paste at the bottom of the stencil. The prior art stencil wiper apparatus will now be described with respect to FIG. 1. The prior art stencil wiper apparatus 10 comprises a paper supply roller 12 containing a roll of paper, a pair of paper guide rollers 14, a hollow solvent tube 16 with numerous holes along its length and a vacuum plenum 18. During a cleaning session, a paper winder motor 22 rotates the paper supply roller 12, which passes paper through the pair of paper guide rollers 14. Between the paper guide rollers 14 there is the hollow solvent tube 16 that is filled with solvent by a solvent pump (not shown) which causes the solvent tube 16 to squirt solvent through its numerous holes onto the paper as it passes by the solvent tube. The solvent impregnated paper is passed to a vacuum plenum 18, which holds the paper in place as the stencil moves over the paper thereby cleaning the stencil. It is desired to provide a method and apparatus for applying solvent onto a material that is an improvement to the stencil wiper apparatus described above.

SUMMARY OF THE INVENTION

According to one aspect of the invention, a printer for printing a viscous material at predetermined positions forming a pattern on a substrate comprises a frame, a device located in an area of the frame and having a number of perforations arranged to form the pattern, a support apparatus mounted to the frame that supports the substrate in a printing position beneath the device, a viscous material dispenser mounted to the frame that contains a viscous material to be printed on the substrate, a device cleaner including a cleaning material dispenser that dispenses a cleaning material to clean a surface of the device, a solvent bath that contains a solvent, and a rotatable bar that rotates in the solvent bath, the rotatable bar being in contact with the cleaning material to apply the solvent in the solvent bath to the cleaning material.

Other features may include one or more of the followings: a motor that rotates the rotatable bar; a reciprocating apparatus mounted to the frame, the device cleaner mounted to the reciprocating apparatus, the reciprocating apparatus moves the device cleaner from one end of the device to another end, and the device cleaner is configured to clean the device as the reciprocating apparatus moves the device cleaner; the device cleaner further comprises a solvent tank that holds a reservoir of solvent, and a first pump that fills the solvent bath with solvent from the solvent tank; the device cleaner further comprises a plurality of ports to drain excess solvent in the solvent bath, and a second pump to return the excess solvent to the solvent tank; the motor is a speed variable motor, and a speed of the variable motor determines an amount of solvent that is applied to the paper; and a vacuum plenum to hold the cleaning material while the device makes contacts with the cleaning material to wipe excess viscous materials from the device.

In another aspect of the invention, the printer for printing a viscous material at predetermined positions forming a pattern on a substrate comprises a frame, a device located in an area of the frame and having a number of perforations arranged to form the pattern, a support apparatus mounted to the frame that supports the substrate in a printing position beneath the device, a material dispenser mounted to frame that contains a viscous material to be printed on the substrate, a device cleaner having a cleaning material that contacts the device to wipe excess material from the device and means for evenly applying a solvent to the cleaning material.

Other features may include one or more of the followings: the solvent applying means includemeans for dispensing the cleaning material, means for containing the solvent and means for rotating in the solvent containing means, the rotating means applying the solvent to the cleaning material as the cleaning material passes the rotating means; the solvent applying means further comprises means for maintaining a predetermined level of solvent in the solvent containing means; and the rotating means further comprises means for varying a quantity of solvent applied to the cleaning material.

In another aspect of the invention, a method for printing a viscous material at predetermined positions forming a pattern on a substrate using a device, the method comprising placing the substrate beneath the device in a printing position, dispensing the viscous material on the device, applying the viscous material across the device to fill the number of perforations in the device to form the pattern on the substrate, wiping excess viscous material from the device wherein the step of wiping includes rotating a bar in a solvent container to draw solvent to the rotating bar, applying the solvent to a cleaning material using the rotating bar, and wiping off excess viscous material on a surface of the device using the cleaning material.

Other features may include one or more of the followings: maintaining a predetermined level of solvent in the solvent container; and varying a speed of the rotating bar to vary an amount of solvent to be applied to the cleaning material.

BRIEF DESCRIPTION OF THE DRAWINGS

For better understanding of the present invention, reference is made to the drawings which are incorporated herein by reference and in which.

DETAILED DESCRIPTION

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used in other applications requiring dispensing of other viscous materials such as glues and encapsulents. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Figure 1:
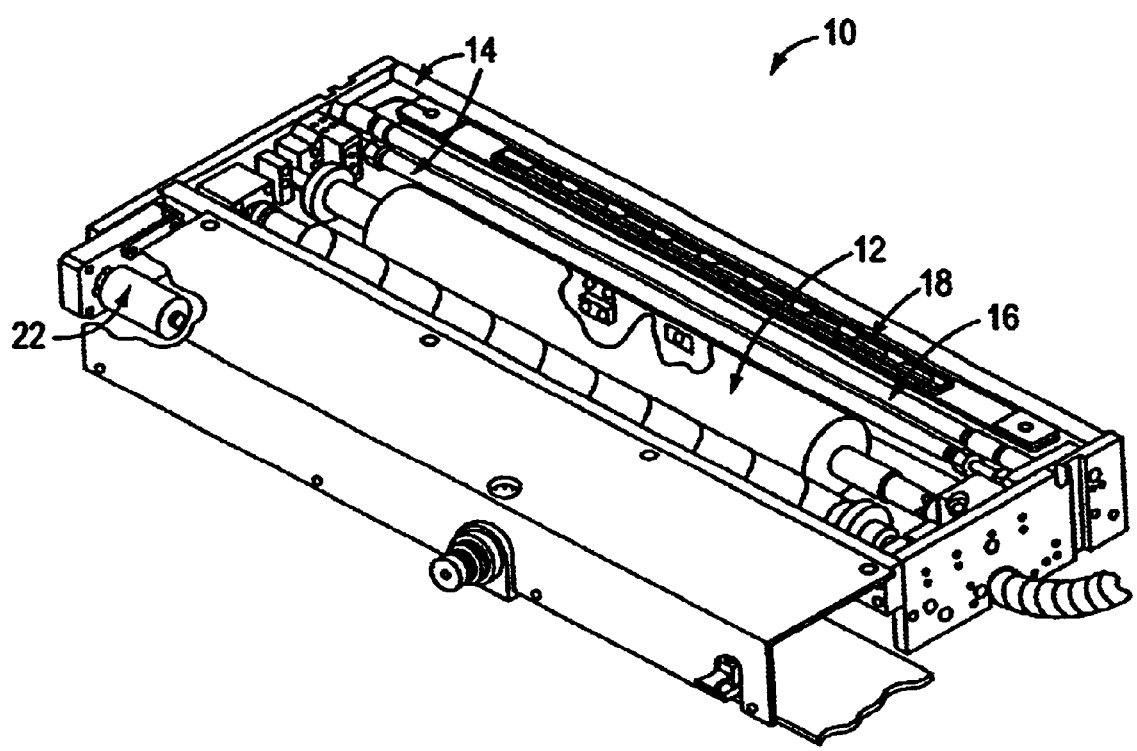
FIG. 1 illustrates a known stencil wiper apparatus.
Figure 2:
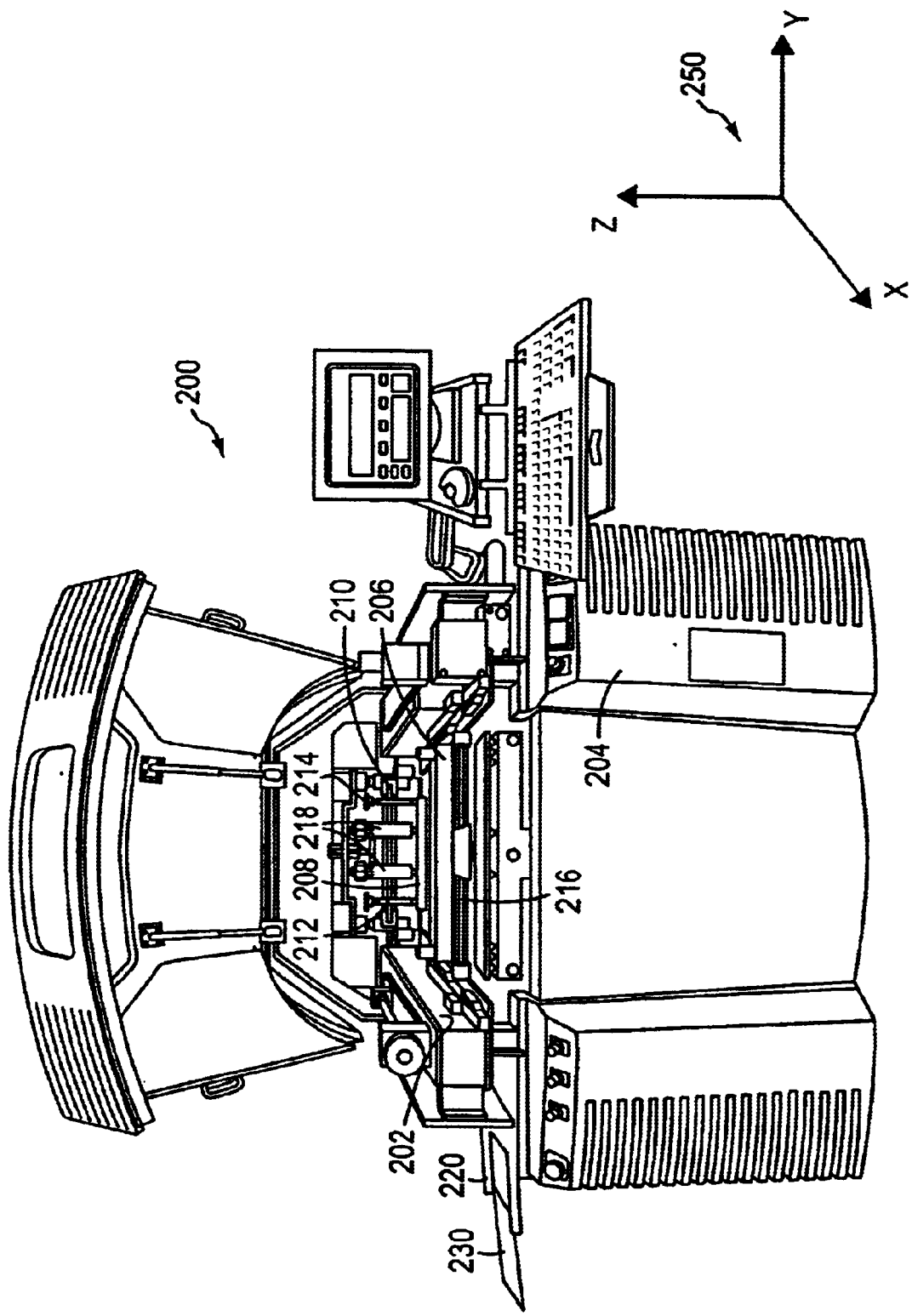
FIG. 2 illustrates a stencil printer in which an embodiment of the invention may be implemented.

FIG. 2 shows a front view of a stencil printer 200 in accordance with one embodiment of the present invention. The stencil printer 200 includes a frame 202 that supports components of the stencil printer 200 including a controller 204, a stencil 206, and a dispensing head 208 having a dispensing slot from which solder paste may be dispensed.

The dispensing head 208 is coupled to a first plate 210 using two thumbscrews 212. The first plate 210 is coupled to a second plate 214 which is coupled to the frame 202 of the stencil printer 200. The first plate 210 is coupled to the second plate 214 in such a manner that the first plate 210 can be moved with respect to the second plate 214 along a z axis, the z axis being defined by the coordinate axis system 250. The first plate 210 is moved by motors under the control of the controller 204.

The second plate 214 is movably coupled to the frame 202 such that the second plate 214 can move with respect to the frame 202 along an x axis, the x axis also being defined by the coordinate axis system. As described below in further detail, the movements of the first and second plates 210, 214 allow the dispensing head 208 to be placed over the stencil 206 and moved across the stencil 206 to allow printing of solder paste onto a circuit board 230.

Stencil printer 200 also includes a conveyor system having rails 220 for transporting a circuit board 230 to a printing position in the stencil printer 200. The stencil printer 200 has a number of pins 216, positioned beneath the circuit board 230 when the circuit board 230 is in the dispensing position. The pins 216 are used to raise the circuit board 230 off of the rails 220 to place the circuit board 230 in contact with, or in close proximity to, the stencil 206 when printing is to occur.

The dispensing head 208 is configured to receive two standard SEMCO three ounce or six ounce solder paste cartridges 218 that provide solder paste to the dispensing head 208 during a printing operation. Each of the solder paste cartridges 218 is coupled to one end of a pneumatic air hose. As readily understood by those skilled in the art, the dispensing head 208 could be adapted to receive other standard, or non-standard, cartridges. The other end of each of the pneumatic air hoses is attached to a compressor that under the control of the controller 204 provides pressurized air to the cartridges to force solder paste to flow from the cartridges 218 into the dispense head 208 and onto the stencil 206. Mechanical devices, such as a piston, may be used in addition to, or in place of, air pressure to force the solder paste from the SEMCO cartridges into the dispensing head. In one embodiment of the present invention, the controller 204 is implemented using a personal computer using the Microsoft DOS or Windows NT operating system with application specific software to control the operation of the stencil printer.

The stencil printer 200 operates as follows. A circuit board 230 is loaded into the stencil printer 200 using the conveyor rails 220. The dispensing head 208 is then lowered in the z direction until it is in contact with the stencil 206. Pressurized air is provided to the cartridges 218 while the dispensing head 208 is moved in the x direction across the stencil 206. The pressurized air forces solder paste out the cartridges 218 and creates pressure on the solder paste in the dispensing head 208 forcing solder paste from the dispensing slot of the dispensing head 208 through apertures in the stencil 206 and onto the circuit board 230. Once the dispensing head 208 has fully traversed the stencil 206, the circuit board 230 is lowered back onto the conveyor rails 220 and transported from the printer 200 so that a second circuit board may be loaded into the printer 200. To print on the second circuit board, the dispensing head 208 is moved across the stencil in the direction opposite to that used for the first circuit board. Alternatively, a squeegee arm (as described below) could swing in to contain the solder paste in the dispenser, and the dispenser can then be lifted in the z direction and moved back to its original position to prepare to print on the second circuit board using a similar direction stroke.

Figure 3:
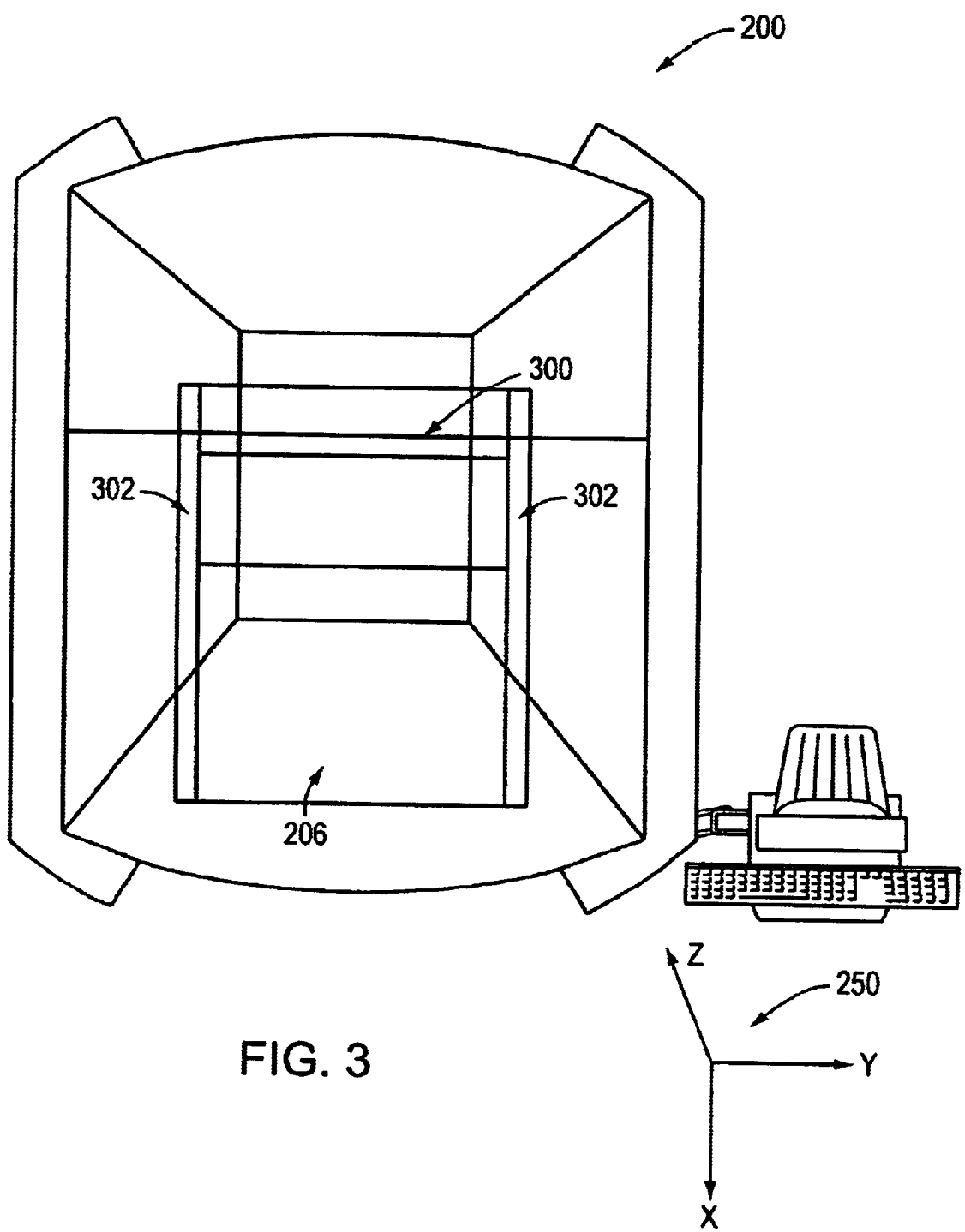
FIG. 3 illustrates a top view of the stencil printer of FIG. 2 showing a stencil cleaning apparatus in accordance with an embodiment of the invention.

After one or more applications of the solder paste to the circuit boards, excess solder paste accumulates at the bottom of the stencil and a stencil cleaning apparatus moves beneath the stencil to remove the excess solder paste. FIG. 3 is a top view of the stencil printer 200 shown in FIG. 2 showing a stencil cleaning apparatus 300 in accordance with one embodiment of the invention. The stencil cleaning apparatus 300 is mounted on a pair of rails 302 and situated at one end of the stencil 206. According to one embodiment of the invention, the stencil cleaning apparatus 300 rides on linear rails 302 and is moved back and forth using a rack and pinion mechanism. Alternatively, a motor and belt mechanism may be used to reciprocate the stencil cleaning apparatus, as well as chain and pulley linear motor, or by an alternative mechanism. The stencil cleaning mechanism may also stay stationary as the stencil is moved over the mechanism. The stencil cleaning apparatus 300 moves back and forth in the x axis direction of the coordinate system 250 beneath the stencil 206 and from one end of the stencil to the other end.

Figure 4:
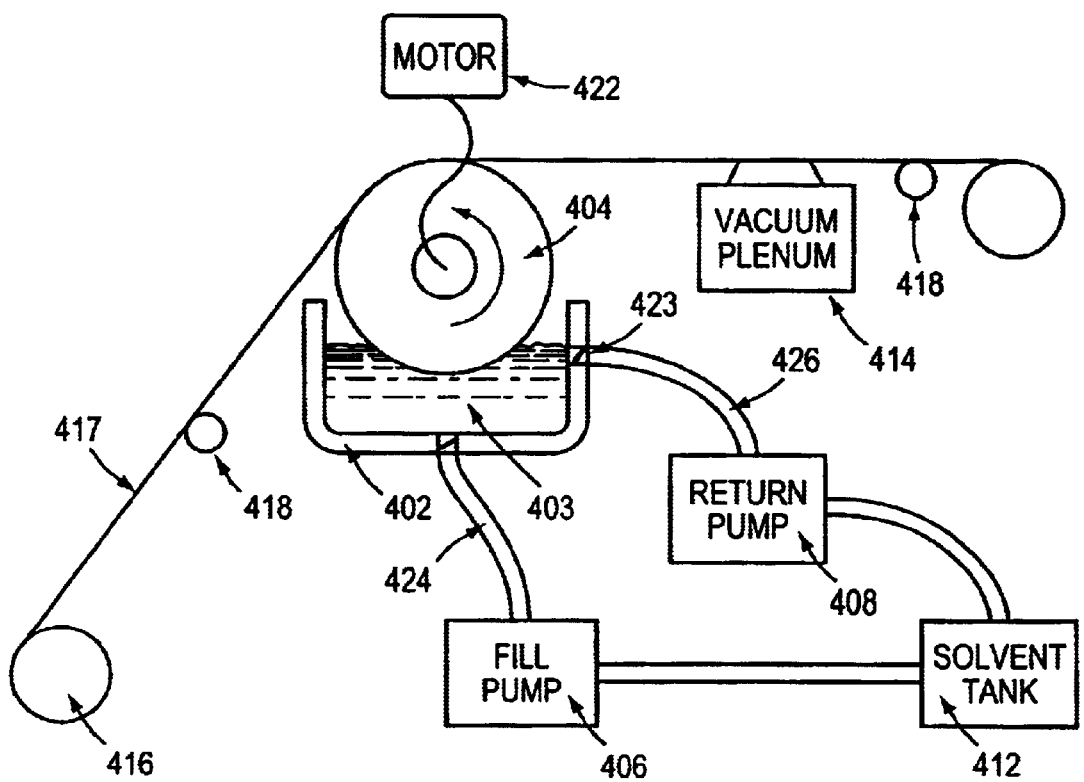
FIG. 4 illustrates a more detailed diagram of the stencil cleaning apparatus in accordance with an embodiment of the invention.

FIG. 4 illustrates a more detailed diagram of the stencil cleaning apparatus 300 of FIG. 3. The stencil cleaning apparatus 300 comprises a solvent bath 402 containing a pool of solvent 403, a solvent bar 404, a fill pump 406, a return pump 408, a solvent tank 412, a vacuum plenum 414, a supply roll 416 containing a roll of paper 417 and a pair of paper guide rollers 418. When activated by a paper winder motor (not shown) the supply roll 416 passes paper 417 over the pair of paper guide rollers 418. The bar 404 is partially disposed in the solvent bath 402. The bar is rotated by a gear motor 422. The solvent bar 404 may be hollow or it may be solid. Although the figure depicts only one bar, several bars may be used in other embodiments of the invention. When the gear motor 422 is activated, the solvent bar 404 rotates in the solvent bath 402. Surface tension between the solvent bar 404 and the solvent 403 causes the solvent 403 to uniformly adhere to the bar 404. The degree of adherence of the solvent to the bar is dependent on material properties of the solvent 403.

As the paper 417 passes over the solvent bath 402 and over the surface or in the vicinity of the bar 404, the bar 404 impregnates the paper 417 with the adhered solvent 403. Because the solvent 403 uniformly adheres to the bar 404, the solvent 403 is uniformly applied to the paper 417. The speed of the rotation of the solvent bar 404 controls the amount of solvent 403 that is pulled up onto the paper 417. Thus, if too much solvent 403 is being applied to the paper 417 the rotational speed of the solvent bar 404 is reduced and conversely if too little solvent 403 is being applied to the bar 404 the rotational speed is increased, thereby providing for a regulated amount of solvent 403 being applied to the paper 417. The vacuum plenum 414 holds the solvent impregnated paper 417 as the stencil is wiped over the paper.

In one embodiment, the solvent bath 402 has a plurality of ports 423 around a circumference of the solvent bath 402. The ports are disposed at a height in the bath that corresponds to a desired level of solvent 403. A fill hose 424 connected to the fill pump 406 is situated at the bottom of the solvent bath 402. The fill pump 406 draws solvent 403 from the solvent tank 412 and pumps the solvent 403 through the fill hose 424 to continuously fill the solvent bath 402 with the solvent 403. The ports 423, on the other hand, continuously removes the solvent 403 of the solvent bath 402 that reaches the level of the ports 423. The ports 423 are connected to a return hose 426 that is connected to a return pump 408. The return pump 408 pumps the solvent 403 back to the solvent tank 412. According to one embodiment, the return pump 408 operates at approximately twice the pump rate of the fill pump 406 to provide a quick drain so as to prevent an overflow in the solvent bath 402.

In embodiments described above, instead of paper being used to wipe the stencil, cloth or similar materials may be used to wipe the stencil. Instead of the stencil cleaning apparatus reciprocating between the ends of the stencil, a stencil retractor assembly may be used which allows the stencil cleaning apparatus to be fixed to the frame of the stencil printer. The stencil retractor assembly retracts the stencil from a printing area and into a cleaning area where the stencil cleaning apparatus cleans the stencil. In an alternative embodiment, instead of using ports to drain excess solvent in the solvent bath, a sensor may be used to monitor the level of solvent in the bath and indicate the level to a controller. The controller in turn operates the fill pump and the return pump to maintain a controlled level. This embodiment allows for a level of solvent in the solvent bath to be dynamically controlled by the controller.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's scope is defined in the following claims and the equivalents thereto.

What is claimed is:

1. A printer for printing a viscous material at predetermined positions forming a pattern on a substrate, the printer comprising:

a frame;

a device located in an area of the frame and having a number of perforations arranged to form the pattern;

a support apparatus mounted to the frame that supports the substrate in a printing position beneath the device;

a viscous material dispenser mounted to the frame that contains a viscous material to be printed on the substrate;

a device cleaner including
  a cleaning material dispenser that dispenses a cleaning material to clean a surface of the device;
  a solvent bath that contains a solvent;
  a rotatable bar that rotates in the solvent bath, the rotatable bar being in contact with the cleaning material to apply the solvent in the solvent bath to the cleaning material; and
  a holding mechanism, spaced from the rotatable bar, and in contact with the cleaning material to apply a force to the cleaning material to hold the cleaning material at a cleaning position at which the cleaning material contacts the device during a cleaning operation.

2. The printer as in claim 1, further comprising:

a motor that rotates the rotatable bar.

3. The printer as in claim 1, further comprising:

a reciprocating apparatus mounted to the frame, the device cleaner mounted to the reciprocating apparatus, wherein the reciprocating apparatus moves the device cleaner from one end of the device to another end; and wherein the device cleaner is configured to clean the device as the reciprocating apparatus moves the device cleaner.

4. The printer as in claim 1, wherein the device cleaner further comprises:

a solvent tank that holds a reservoir of solvent; and a first pump that fills the solvent bath with solvent from the solvent tank.

5. The printer as in claim 4, wherein the device cleaner further comprises:

a plurality of ports to drain excess solvent in the solvent bath; and a second pump to return the excess solvent to the solvent tank.

6. The printer as in claim 2, wherein:

the motor is a speed variable motor, and wherein a speed of the variable motor determines an amount of solvent that is applied to the paper, such that if the speed of the motor is reduced, a rotational speed of the rotatable bar is reduced and less solvent is applied to the paper.

7. The printer as in claim 1, wherein the holding mechanism includes:

a vacuum plenum to hold the cleaning material while the device makes contacts with the cleaning material to wipe excess viscous materials from the device.

8. A printer for printing a viscous material at predetermined positions forming a pattern on a substrate, the printer comprising:

a frame;

a device located in an area of the frame and having a number of perforations arranged to form the pattern;

a support apparatus mounted to the frame that supports the substrate in a printing position beneath the device;

a material dispenser mounted to the frame that contains a viscous material to be printed on the substrate;

a device cleaner having a cleaning material that contacts the device to wipe excess material from the device, the device cleaner including a holding mechanism that applies a holding force to the cleaning material at a cleaning position;

means for evenly applying a solvent to the cleaning material;

means for dispensing the cleaning material;

means for containing the solvent; and means for rotating in the solvent containing means, the rotating means applying the solvent to the cleaning material as the cleaning material passes the rotating means.

9. The printer of claim 8, wherein the holding device includes a vacuum device that applies a vacuum pressure to the cleaning material.

10. The printer as in claim 8, wherein the means for applying the solvent further comprises:

means for maintaining a predetermined level of solvent in the solvent containing means.

11. The printer as in claim 8, wherein the rotating means further comprises:

means for varying a quantity of solvent applied to the cleaning material.

12. A method for printing a viscous material at predetermined positions forming a pattern on a substrate using a device, the method comprising:

placing the substrate beneath the device in a printing position;

dispensing the viscous material on the device;

applying the viscous material across the device to fill the number of perforations in the device to form the pattern on the substrate;

wiping excess viscous material from the device wherein the step of wiping includes:

rotating a bar in a solvent container to draw solvent to the rotating bar;

applying the solvent to a cleaning material using the rotating bar;

holding the material at a cleaning position, separated from the rotating bar; and wiping off excess viscous material on a surface of the device using the cleaning material.

13. The method as in claim 12, further comprising:

maintaining a predetermined level of solvent in the solvent container.

14. The method as in claim 12, wherein rotating the bar further comprises:

varying a speed of the rotating bar to vary an amount of solvent to be applied to the cleaning material.

15. The method of claim 12, wherein holding the material includes using a vacuum pressure to hold the material.

* * * * *